(12) United States Patent
Aoyagi et al.

(10) Patent No.: US 6,825,894 B2
(45) Date of Patent: Nov. 30, 2004

(54) LIQUID CRYSTAL DISPLAY DEVICE

(75) Inventors: Masayuki Aoyagi, Ohhara (JP); Yasushi Morika, Mobara (JP)

(73) Assignees: Hitachi, Ltd., Tokyo (JP); Hitachi Electronic Devices Co., Ltd., Chiba-ken (JP)

( * ) Notice: Subject to any disclaimer, the term of this patent is extended or adjusted under 35 U.S.C. 154(b) by 0 days.

(21) Appl. No.: 10/141,140

(22) Filed: May 9, 2002

(65) Prior Publication Data
US 2002/0180923 A1 Dec. 5, 2002

(30) Foreign Application Priority Data
May 30, 2001 (JP) ........................................ 2001-163017

(51) Int. Cl.[7] ..................... G02F 1/1335; G02F 1/1333; G06F 1/16; H05K 7/20; H01L 33/00
(52) U.S. Cl. .............................. 349/61; 349/58; 349/65; 361/681; 361/714; 361/752; 257/88
(58) Field of Search .............................. 349/61, 58, 65; 361/681, 714, 752; 257/88

(56) References Cited
FOREIGN PATENT DOCUMENTS

| | | |
|---|---|---|
| EP | 1 111 738 A1 | 8/1999 |
| JP | 11-133426 | 10/1997 |
| JP | 2000-77724 | 8/1998 |
| JP | 2001-068738 | 8/1999 |
| JP | 2001-185762 | 12/1999 |

OTHER PUBLICATIONS

LED Lamp News (from Rohm's web site) and translation in English.

*Primary Examiner*—Tarifur R. Chowdhury
*Assistant Examiner*—Hoan Chau Nguyen
(74) *Attorney, Agent, or Firm*—Reed Smith LLP; Stanley P. Fisher, Esq.; Juan Carlos A. Marquez, Esq.

(57) ABSTRACT

Light-emitting elements can be accurately directly opposed to the entrance surface of a light guide at an accurate distance therefrom, and can be mounted on a single side of a printed circuit board together with other electronic components, whereby the number of manufacturing steps and the thickness of a liquid crystal display device can be reduced. The light guide and the printed circuit board are disposed on the back surface of the liquid crystal display panel, and the respective light-emitting elements are inserted through through-holes formed to extend through the printed circuit board, with the light-emitting portions of the respective light-emitting elements opposed to the entrance surface of the light guide. The light-emitting elements, together with the other electronic components, are mounted on the printed circuit board from one side. Electrodes of the light-emitting elements are bridged and secured to a mounting surface of the printed circuit board.

20 Claims, 9 Drawing Sheets

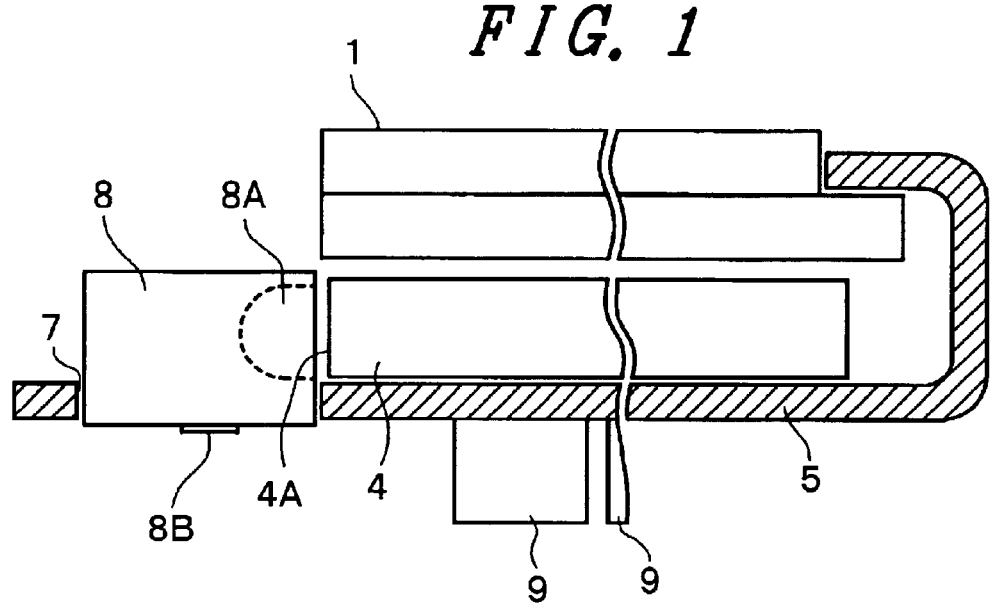
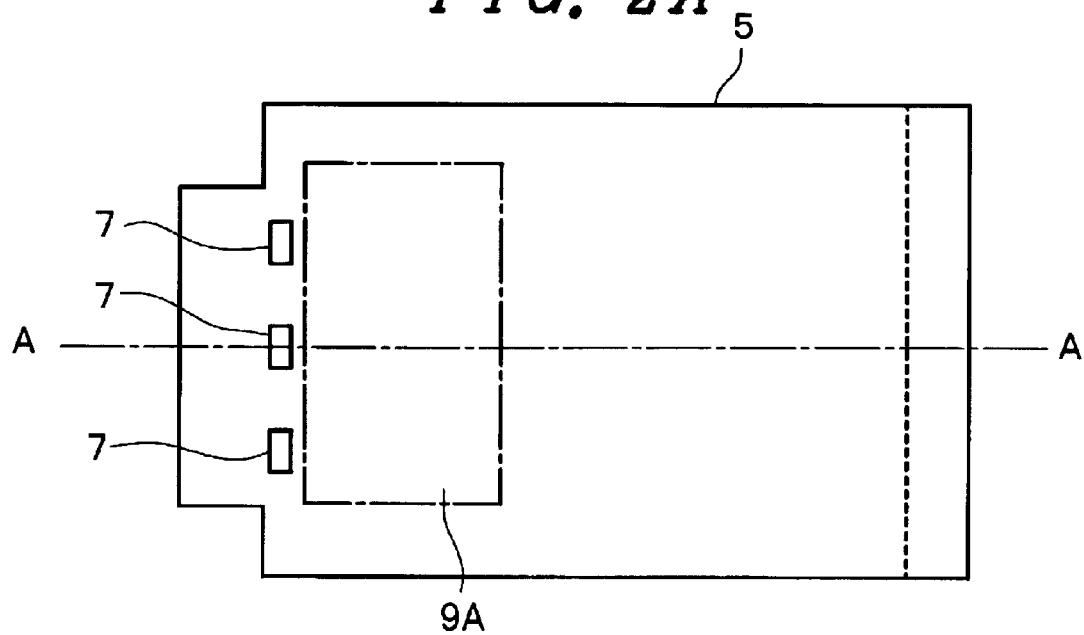
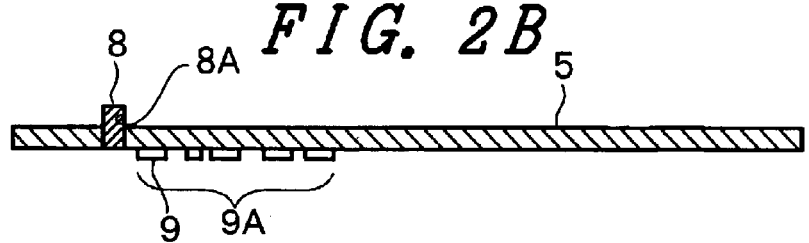

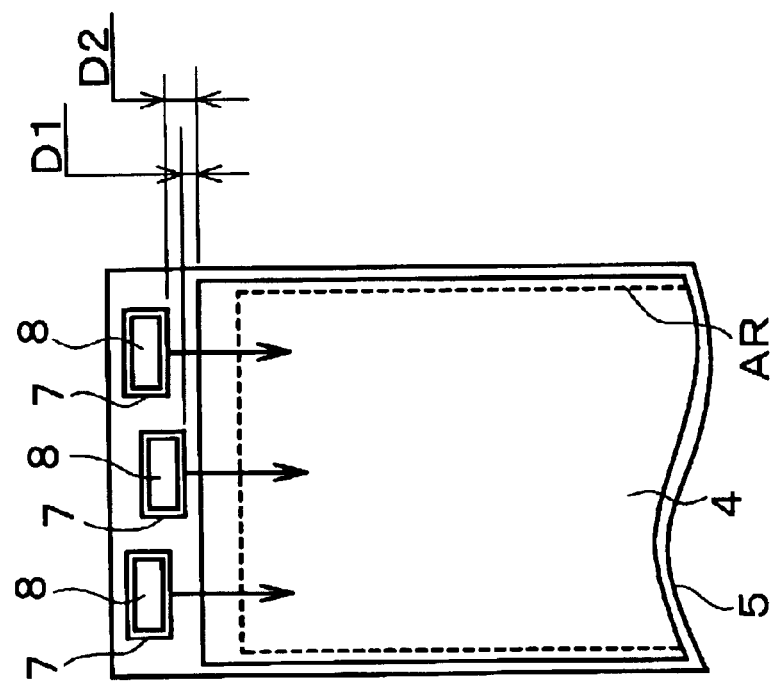
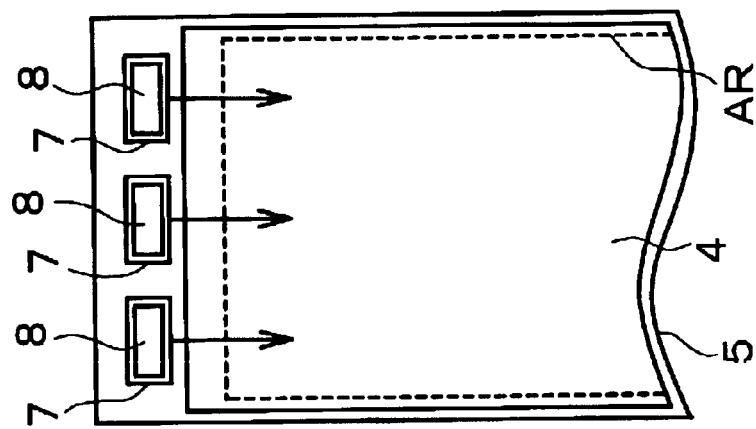
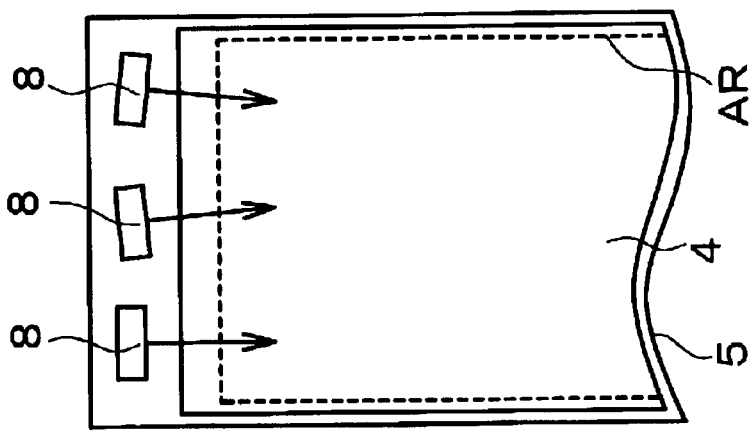
FIG. 5A PRIOR ART
FIG. 5B
FIG. 5C

FIG. 12A
PRIOR ART
FIG. 12B
PRIOR ART
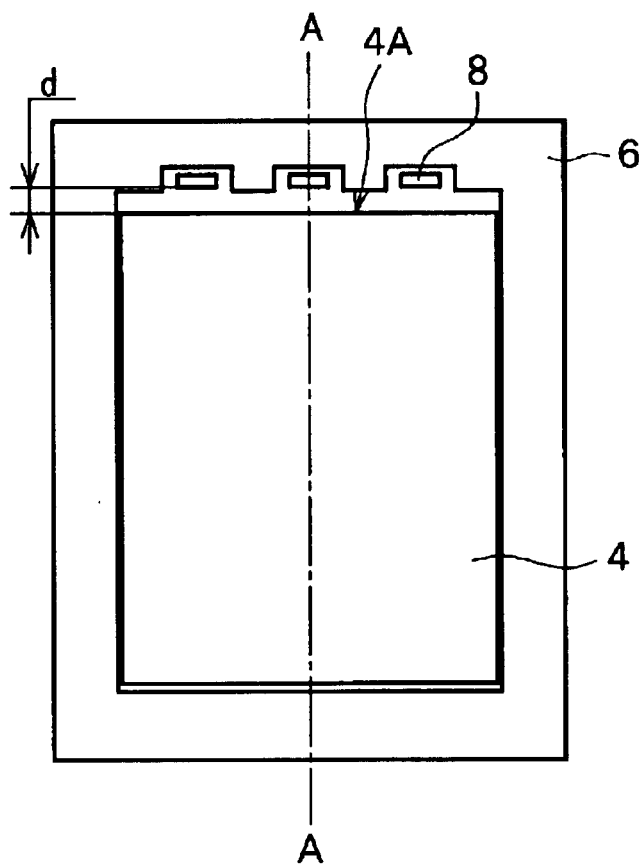
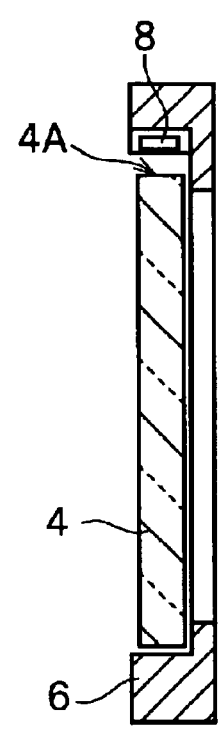
FIG. 13
PRIOR ART
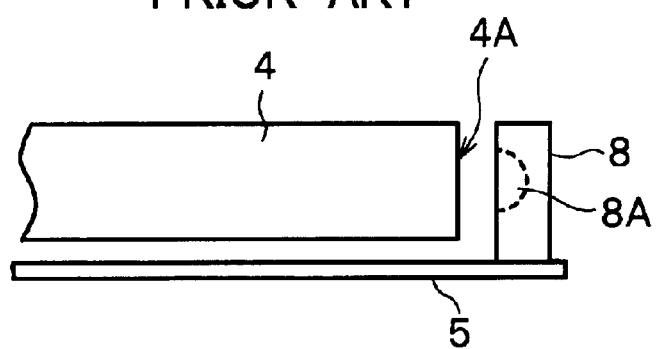

LIQUID CRYSTAL DISPLAY DEVICE

BACKGROUND OF THE INVENTION

The present invention relates to a liquid crystal display device and, more particularly, to a liquid crystal display device which is provided with an auxiliary light source device having a light guide with solid-state light-emitting elements such as light-emitting diodes disposed at a side edge of the light guide as a light source.

In small-sized information terminals such as mobile telephones or mobile information terminals, it is general practice to adopt, as their display devices, liquid crystal display devices which are energy efficient, small-sized and light weight. The liquid crystal display devices are classified into two types: one type in which external light is utilized as illuminating means for visualizing an electronic latent image formed on a liquid crystal display panel; and the other type in which an auxiliary illuminating device is disposed on the back or front surface of a liquid crystal display panel. The auxiliary illuminating device disposed on the back surface of the liquid crystal display panel is called a backlight, while the auxiliary illuminating device disposed on the front surface of the liquid crystal display panel is called a frontlight.

As a light source for this kind of auxiliary illuminating device of such a mobile terminal, there is a light source which has a light guide with a cold cathode fluorescent tube disposed at a side edge of the light guide, as in a notebook personal computer having a comparatively large display screen size. However, many mobile telephones and small-sized mobile information terminals (such as PDAs) use solid-state light-emitting elements such as light-emitting diodes (LEDs) with low power consumption.

FIG. 11 is a diagrammatic explanatory perspective view of the entire construction of a related-art auxiliary illuminating device in a small-sized information terminal. This auxiliary illuminating device is disposed on the back surface of a liquid crystal display panel. The liquid crystal display panel, a printed circuit board and the like are not shown. Two prism sheets 2 are disposed directly below the liquid crystal display panel, and a diffusing sheet 3, a light guide 4 and a reflecting sheet 10 are disposed in that order below the two prism sheets 2. Reference numeral 8 denotes a light-emitting element which emits white light, and in general, a light-emitting diode (LED) is used. In the following description, this kind of light-emitting element is referred to as an LED.

FIGS. 12A and 12B are explanatory views of a structural example in which LEDs constituting the light source of the related-art auxiliary illuminating device are disposed in a small-sized information terminal. FIG. 12A is a plan view, and FIG. 12B is a cross-sectional view taken along line A—A of FIG. 12A. In FIGS. 12A and 12B, reference numeral 4 denotes a light guide, reference numeral 4A denotes a side edge (hereinafter referred to also as an entrance surface). Reference numeral 6 denotes a box-like case (molded case), and reference numeral 8 denotes an LED. In this structural example, one or two or more LEDs 8 are disposed on the inside wall of the molded case 6. In this example, three LEDs 8 are arranged.

However, in this construction, since the light guide 4 and the LEDs 8 are incorporated in the molded case 6 as separate components, it is difficult to mount the LEDs 8 accurately on the inside wall of the molded case 6, and a variation easily occurs in a distance d between the light-emitting portions of the respective LEDs 8 (that lie on the surfaces of the respective LEDs 8 opposed to the entrance surface 4A of the light guide 4) and the entrance surface 4A of the light guide 4. In addition, the light-emitting parts and the entrance surface 4A of the light guide 4 are difficult to oppose precisely directly. For this reason, the distribution of light which is emitted from the LEDs 8 and enters the light guide 4 becomes nonuniform therein, so that irregularity may occur in the display luminance of the liquid crystal display panel. This has been one problem to be solved in the related art.

Moreover, because of the structure in which the LEDs 8 are mounted in the molded case 6, wiring means is needed for connecting power supply lines for the LEDs 8 to power source terminals (or power source electrodes) of driver circuits mounted on a printed circuit board (not shown), so that the assembling process becomes complicated. This has been another problem to be solved in the related art. Incidentally, this kind of related art is disclosed in, for example, Japanese Patent Laid-Open No. 133426/1999.

To solve the above-described problem, various proposals which will be described below have been made. FIG. 13 is a diagrammatic explanatory cross-sectional view of an example of the essential construction of a proposed example of an auxiliary illuminating device in a small-sized information terminal. FIG. 13 mainly shows the light guide 4 of the auxiliary illuminating device and the LEDs 8 which are light-emitting elements. In this construction, the LEDs 8 to be disposed in proximity to or in intimate contact with one end (the side edge 4A) of the light guide 4 suitably made of a transparent resin are mounted on a printed circuit board 5, and this printed circuit board 5 is disposed on the back surface of the light guide 4. Incidentally, as the printed circuit board 5, a non-flexible type made of a hard plate or a type made of a flexible sheet (a so-called flexible printed circuit board) is available, and in the following description, both types will be collectively referred to as "printed circuit board".

Since the LEDs 8 are ordinarily mounted on the printed circuit board 5 by an automatic mounting apparatus, their mounting positions can be controlled accurately. In addition, the light guide 4 is secured to the back surface of a liquid crystal display panel (not shown) by an adhesive agent or a double-sided adhesive tape, and the printed circuit board 5 is constructed to be connected to the liquid crystal display panel. Accordingly, light-emitting portions 8A of the respective LEDs 8 can be disposed to be accurately directly opposed to the side edge 4A which is the entrance surface of the light guide 4. Incidentally, although not shown, a reflection-processed film or a reflecting sheet are disposed on the back surface of the light guide 4.

FIG. 14 is a diagrammatic explanatory view of an example of the essential construction of a liquid crystal display device, aiding in explaining the problem of the construction shown in FIG. 13. FIG. 14 is an explanatory cross-sectional view particularly showing the arrangement relationship between the printed circuit board 5 on which the LEDs 8 are mounted as the light-emitting elements of the auxiliary illuminating device, and the light guide 4 as well as a liquid crystal display panel 1. The LEDs 8 are disposed in proximity to or in intimate contact with the side edge 4A of the light guide 4 disposed on the back surface of the liquid crystal display panel 1. Although the printed circuit board 5 is herein described as a hard printed circuit board, the same description applies to a flexible printed circuit board.

The LEDs 8 are mounted on the printed circuit board 5 with the light-emitting portions 8A facing the side edge 4A of the light guide 4. Light emitted from the light-emitting portions 8A of the LEDs 8 is directed in a direction approximately parallel to the plane of the printed circuit board 5. The respective LEDs 8 have electrodes 8B at their bottoms, and these electrodes 8B are connected to the wiring of the printed circuit board 5, whereby the LEDs 8 are secured and electrically connected to the printed circuit board 5. Other electronic components 9 are mounted on the surface of the printed circuit board 5 opposite to the surface on which the LEDs 8 are mounted. In other words, the LEDs 8 and those other electronic components 9 are mounted on the opposite sides of the printed circuit board 5, and this mounting method is called dual-sided mounting.

FIG. 15 is a diagrammatic explanatory view of an example of the essential construction of another proposed example of the auxiliary illuminating device in the small-sized information terminal. FIG. 15 is an explanatory cross-sectional view particularly showing the arrangement relationship between the printed circuit board 5 on which the LEDs 8 are mounted and the light guide 4 as well as the liquid crystal display panel 1. The LEDs 8 are mounted on the same surface of the printed circuit board 5 as the other electronic components 9 and at a portion near one end of the printed circuit board 5. The portion where the LEDs 8 are mounted is folded in the direction of the liquid crystal display panel 1, and in a manner similar to that shown in FIG. 14, the respective light-emitting portions 8A of the LEDs 8 are disposed in proximity to or in intimate contact with the side edge 4A of the light guide 4 disposed on the back surface of the liquid crystal display panel 1, in such a manner that the light-emitting portions 8A are opposed to the side edge 4A.

The LEDs 8 are mounted on the printed circuit board 5 with the light-emitting portions 8A facing the side edge (entrance surface) 4A of the light guide 4. Light emitted from the light-emitting portions 8A is directed in a direction approximately parallel to the plane of the printed circuit board 5 and enters the entrance surface 4A of the light guide 4. The respective LEDs 8 have the electrodes 8B at their bottoms, and these electrodes 8B are connected to the wiring of the printed circuit board 5, whereby the LEDs 8 are secured and electrically connected to the printed circuit board 5. The other electronic components 9 are mounted on the same surface as the surface where the LEDs 8 are mounted. In this example, the LEDs 8 and the other electronic components 9 are mounted on the same surface of the printed circuit board 5, and this mounting method is called single-sided mounting.

Incidentally, a related art associated with the mounting of the LEDs 8 on the printed circuit board 5 is disposed in Japanese Patent Laid-Open No. 77724/2000. This laid-open document does not have any disclosure as to liquid crystal display devices. The mounting art disclosed in this laid-open document relates to the mounting of a single light-emitting element or of a light-emitting element and a light-receiving element, and aims at reducing the total thickness of a printed circuit board. However, the light-emitting direction of the light-emitting element is a direction perpendicular to the plane of the printed circuit board, and is not intended to solve problems to be solved by the invention, which occur when emitted light is made to enter a light guide in a direction parallel to a printed circuit board.

The example of mounting the LEDs in the auxiliary illuminating device according to each of the above-described proposals has the following problems. For instance, in the case of the dual-sided mounting in which the LEDs 8 are mounted on the surface of the printed circuit board 5 opposite to the surface where the other electronic components 9 are mounted, as shown in FIG. 14, mounting work for the printed circuit board 5 is complicated, and the process of performing mounting on two surfaces is needed in the automatic mounting apparatus. In the case where the single-sided mounting type of printed circuit board 5 described above with reference to FIG. 15 is used, the portion where the LEDs 8 are mounted needs to be folded so that the light-emitting portions 8A are opposed to the side edge 4A of the light guide 4. Accordingly, a folding process is needed, so that work efficiency lowers and cracks or the like may occur in a folded portion, incurring malfunction. In addition, the thickness of the auxiliary illuminating device increases, with the result that this increase of the thickness hinders a further reduction in the entire thickness of a liquid crystal display device in which such an auxiliary illuminating device is incorporated, and hence a further reduction in the thickness of a terminal using such a liquid crystal display device.

Moreover, in each of the above-described mounting methods, since the LEDs 8 are mounted on the mounting surface of the printed circuit board 5, the distance between the light-emitting portions 8A of the respective LEDs 8 and the surface of the printed circuit board 5 can only be reduced within a limited range beyond which no further reduction in thickness is possible. Since the respective light-emitting portions 8A of the LEDs 8 lie inside the molded surfaces of the LEDs 8, the thickness of the light guide 4 can only be made smaller than the size of the light-emitting portion 8A of each of the LEDs 8 directly opposed to the light guide 4, within a limited range in terms of the efficiency of utilization of illuminating light. These limitations are also a cause which hinders a further reduction in the thickness of the auxiliary illuminating device as well as a further reduction in the thickness of the entire terminal in which the auxiliary illuminating device is incorporated.

The invention solves the problems of the above-described related arts and provides a liquid crystal display device in which light-emitting elements such as LEDs which constitute an auxiliary illuminating device can be mounted on a printed circuit board together with other electronic components by single-sided mounting and the light-emitting elements can be opposed to the entrance surface of a light guide without the need to fold the printed circuit board, whereby further reductions in the number of manufacturing steps and in the thickness of the liquid crystal display device can be promoted.

SUMMARY OF THE INVENTION

Therefore, a basic concept of the invention resides in a construction in which a printed circuit board on which to mount a light-emitting element is provided with a through-hole through which to insert the light-emitting element and the light-emitting element is mounted in the through-hole by single-sided mounting. The light-emitting element and the other electronic components are mounted on the same surface of the printed circuit board. The typical constructions of the invention are as follows.

(1) A liquid crystal display device includes a liquid crystal display panel, a printed circuit board on which a plurality of electronic components including a light-emitting element are mounted, and a light guide provided between the liquid crystal display panel and the printed circuit board. The printed circuit board has a through-hole, and the light-emitting element is mounted on the printed circuit board from the same side as other electronic components with a light-emitting portion of the light-emitting element projected from the through-hole into a side opposite to the other electronic components.

(2) In (1), the light-emitting portion of the light-emitting element is projected from the printed circuit board into a side where the light guide is disposed.

(3) In (1) or (2), a light-emitting direction of the light-emitting element is approximately parallel to a surface of the printed circuit board.

(4) In any of (1) to (3), the printed circuit board is a flexible printed circuit board.

According to the construction described in (1) to (4), on the printed circuit board on which the light-emitting element is mounted from the same side together with the other electronic components, the light-emitting portion of the light-emitting element can be directly opposed to the entrance surface of the light guide without the need to fold the printed circuit board in the portion of the light-emitting element, whereby the number of manufacturing steps can be reduced. In addition, since a flexible printed circuit board is used, it is possible to easily provide electrical connection between the printed circuit board and the liquid crystal display panel.

(5) A liquid crystal display device includes a liquid crystal display panel, a printed circuit board on which a light-emitting element is mounted, and a light guide provided between the liquid crystal display panel and the printed circuit board. The printed circuit board has a through-hole, and the light-emitting element which has a light-emitting direction approximately parallel to a surface of the printed circuit board is mounted in the state of being inserted through the through-hole.

(6) In (5), an end of the light-emitting portion of the light-emitting element on the side of the printed circuit board is approximately equal in position to the surface of the printed circuit board.

(7) In (5) or (6), the light guide is smaller in thickness than the light-emitting element in portion thereof which is respectively projected from the through-hole of the printed circuit board.

(8) In any of (5) to (7), the printed circuit board is a flexible printed circuit board.

According to the construction described in (5) to (8), the thickness of a liquid crystal display device can be reduced.

(9) A liquid crystal display device includes a liquid crystal display panel, a printed circuit board on which a plurality of electronic components including a light-emitting element are mounted, and a light guide provided between the liquid crystal display panel and the printed circuit board. The printed circuit board has a through-hole through which the light-emitting element is inserted, and electrodes of the light-emitting element and electrodes of other electronic components are connected to the printed circuit board on a side of the printed circuit board opposite to the light guide.

(10) In (9), the printed circuit board is a flexible printed circuit board.

According to the construction described in (9) or (10), the light-emitting portion of the light-emitting element can be accurately directly opposed to the entrance surface of the light guide without the need to fold the printed circuit board on which the light-emitting element is mounted, and the light-emitting element and the other electronic components can be connected to the printed circuit board in the same process, whereby the number of manufacturing steps can be reduced. In addition, since a flexible printed circuit board is used, it is possible to easily provide electrical connection between the printed circuit board and the liquid crystal display panel.

(11) A liquid crystal display device includes a liquid crystal display panel, a printed circuit board on which a plurality of light-emitting elements are mounted, and a light guide provided between the liquid crystal display panel and the printed circuit board. The printed circuit board has a plurality of through-holes approximately equidistant from an end of the light guide, and the plurality of light-emitting elements are mounted in the state of being inserted through the respective through-holes.

(12) In (11), the through-holes and the light-emitting elements have positioning means.

(13) In (11) or (12), the printed circuit board is a flexible printed circuit board.

According to the construction described in (11) to (13), by bringing the plurality of light-emitting elements into abutment with positioning shapes specially provided on the inner peripheries of the respective through-holes or the respective through-holes, the positions of the light-emitting elements relative to the entrance surface of the light guide are restricted, whereby the distance between the light-emitting elements and the entrance surface of the light guide can be maintained at a design value and the occurrence of luminance irregularity on the display screen of the liquid crystal display panel can be restrained.

Incidentally, the liquid crystal display panel used in the invention is not limited to a so-called simple matrix type, and may also use an active matrix type of liquid crystal display panel such as a thin film transistor type or various other types of liquid crystal display panels.

Moreover, a liquid crystal display device using a frontlight can be constructed in a similar manner as to a structure in which its light-emitting elements are mounted on its printed circuit board. In this case, a light guide is not needed or is disposed on the display screen of its liquid crystal display panel, and the printed circuit board is disposed on the back surface of the liquid crystal display panel. In addition, the size of the liquid crystal display panel is not limited to a small size such as those of mobile telephones or mobile information terminals, and the invention can also be applied to a liquid crystal display panel of comparatively large size.

It goes without saying that the invention is not limited to any of the above-described constructions nor the construction of any of embodiments which will be described later, and various modifications can be made without departing from the technical ideas of the invention.

BRIEF DESCRIPTION OF THE DRAWINGS

The invention will become more readily appreciated and understood from the following detailed description of preferred embodiments of the invention when taken in conjunction with the accompanying drawings, in which:

FIG. 1 is a cross-sectional view diagrammatically showing essential portions aiding in describing a first embodiment of a liquid crystal display device according to the invention;

FIGS. 2A and 2B are explanatory views of an example of the construction of the printed circuit board shown in FIG. 1, FIG. 2A being a plan view seen from the side where the liquid crystal display panel is located, and FIG. 2B being a cross-sectional view taken along line A—A of FIG. 2A;

FIGS. 5A to 5C are explanatory views of the advantage of the mounting structure of LEDs on the printed circuit board which constitutes an auxiliary illuminating device in the liquid crystal display device according to the invention, FIG. 5A being a schematic plan view showing for comparison purposes a case in which a printed circuit board does not have mounting through-holes for LEDs, and FIGS. 5B and 5C being schematic plan views showing different cases in each of which a printed circuit board has mounting through-holes for LEDs;

FIGS. 12A and 12B are explanatory views of a structural example in which LEDs constituting the light source of the related-art auxiliary illuminating device are disposed in a small-sized information terminal, FIG. 12A being a plan view, and FIG. 12B being a cross-sectional view taken along line A—A of FIG. 12A;

FIG. 13 is a diagrammatic explanatory cross-sectional view of an example of the essential construction of a proposed example of an auxiliary illuminating device in a small-sized information terminal;

DESCRIPTION OF THE PREFERRED EMBODIMENTS

Figure 3:
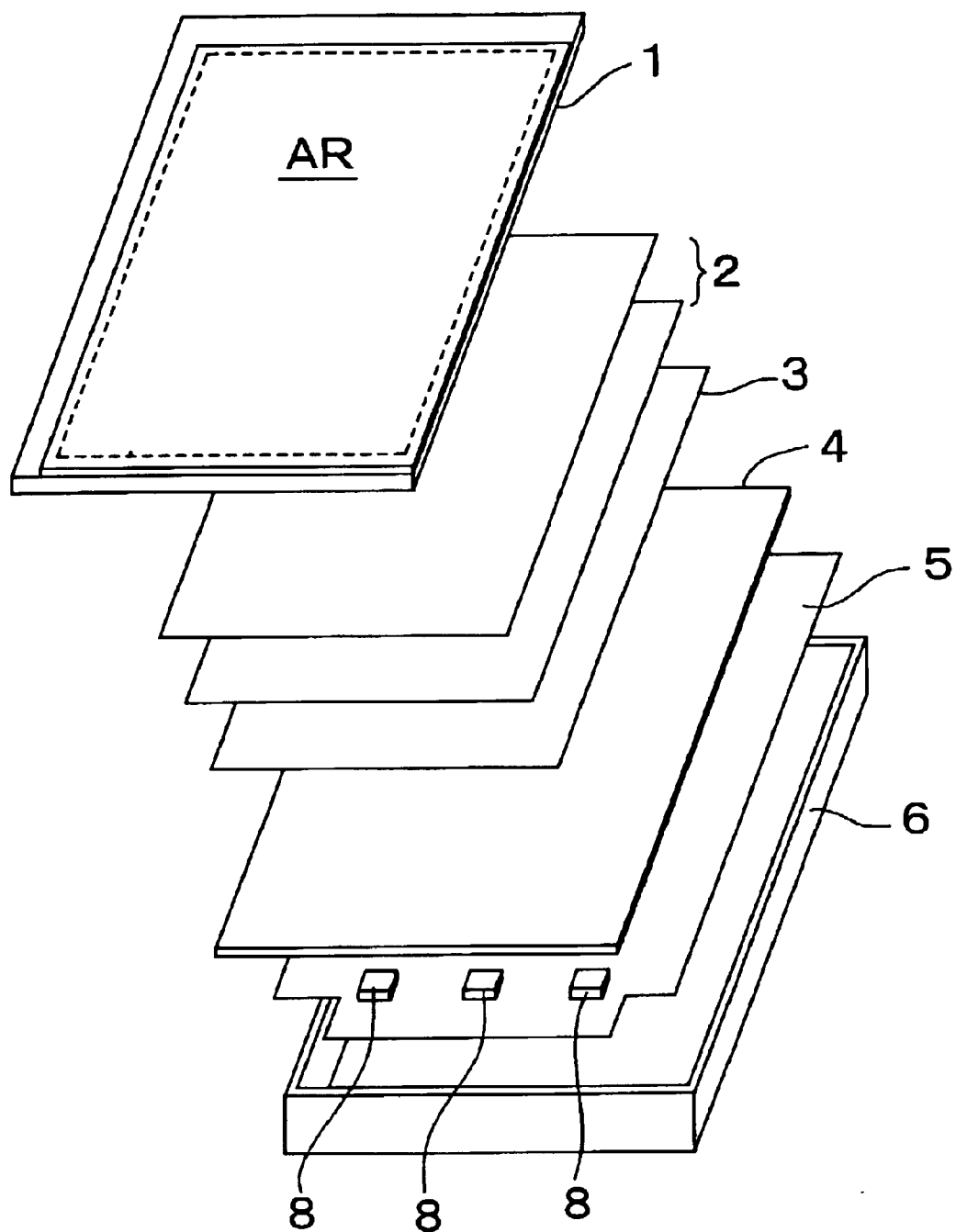
FIG. 3 is a developed perspective view aiding in describing the entire construction of the first embodiment of the liquid crystal display device according to the invention.

Preferred embodiments of the invention will be described below in detail with reference to the drawings of the embodiments. FIG. 1 is a cross-sectional view aiding in describing a first embodiment of a liquid crystal display device according to the invention, diagrammatically showing the essential parts of the first embodiment. In an auxiliary illuminating device of the first embodiment, LEDs 8 are disposed as light-emitting elements at a side edge 4A which is an entrance surface of a light guide 4 made of a transparent plate such as an acrylic plate, and light emitted from the LEDs 8 is made to enter and propagate in the light guide 4. During this propagation, the light is made to exit from the obverse side of the light guide 4 (in the direction of a liquid crystal display panel 1), thereby forming a surface light source which illuminates the entire surface of the liquid crystal display panel 1 from behind the liquid crystal display panel 1.

The LEDs 8 are mounted in the state of being respectively inserted through through-holes 7 formed in a printed circuit board 5. This printed circuit board 5 is a flexible printed circuit board. The printed circuit board 5 of the first embodiment is folded toward the liquid crystal display panel 1 at an end portion opposite to the side where the LEDs 8 are mounted, and is connected to an electrode terminal led out of either one of the substrates of the liquid crystal display panel 1. Incidentally, at an end portion where the LEDs 8 are mounted or an end portion adjacent to the end where the LEDs 8 are mounted, the printed circuit board 5 may be folded and connected to a terminal of the liquid crystal display panel 1.

In a light-emitting portion 8A of each of the LEDs 8, in terms of the efficiency of utilization of light, it is desirable that the size of the light-emitting portion 8A taken in the thickness direction of the light guide 4 be made not greater than the thickness of the entrance surface 4A of the light guide 4. In the first embodiment, both are made approximately equal. Other electronic components 9 such as driver ICs, resistors and capacitors are mounted on the printed circuit board 5. The LEDs 8 are mounted in the same direction as these other electronic components 9, and an electrode 8B provided at the bottom of each of the LEDs 8 is bridged to the mounting surface of the printed circuit board 5 and is electrically connected and secured to the printed circuit board 5. In other words, such various components (the LEDs 8 and the other electronic components 9) are mounted on the printed circuit board 5 by single-sided mounting. Incidentally, a diffusing sheet and a prism sheet are interposed between the liquid crystal display panel 1 and the auxiliary illuminating device, but their illustration is omitted in FIG. 1.

FIGS. 2A and 2B are explanatory views of an example of the construction of the printed circuit board shown in FIG. 1. FIG. 2A is a plan view seen from the side where the liquid crystal display panel is located, and FIG. 2B is a cross-sectional view taken along line A—A of FIG. 2A. Reference numeral 9A is an area in which the other electronic components 9 are mounted. It goes without saying that the mounting area 9A is not limited to the shown portion.

According to the first embodiment, as to the printed circuit board 5 on which the light-emitting elements 8 such as LEDs are mounted from the same side together with the other electronic components 9, the light-emitting portions 8A of the respective light-emitting elements 8 can be disposed in opposition to the entrance surface 4A of the light guide 4 without the need to fold the printed circuit board 5 in the portion of the light-emitting elements 8, thereby enabling a reduction in the number of process steps. In addition, by using the flexible printed circuit board 5, it is possible to easily provide electrical connection between the liquid crystal display panel 1 and the printed circuit board 5.

FIG. 3 is a developed perspective view aiding in describing the entire construction of the first embodiment of the liquid crystal display device according to the invention. Fixing means such as a spacer or double-sided adhesive tape is interposed in the required portion between each constituent element, but their illustration is omitted for ease of understanding. Two prism sheets 2 and a diffusing sheet 3 are inserted at the back of the liquid crystal display panel 1, and the light guide 4 is disposed under the diffusing sheet 3. Positioned under the light guide 4 is the printed circuit board 5 on which the LEDs 8 and the other electronic components 9 are mounted.

The liquid crystal display panel 1, the prism sheets 2, the diffusing sheet 3, the light guide 4 and the printed circuit board 5 are accommodated in a molded case 6 which is a box-like case, to constitute an integral liquid crystal display device. An area shown by dashed lines in the liquid crystal display panel 1 denotes a display area AR, and approximately coincides with an area to be illuminated by the light guide 4.

Figure 4:
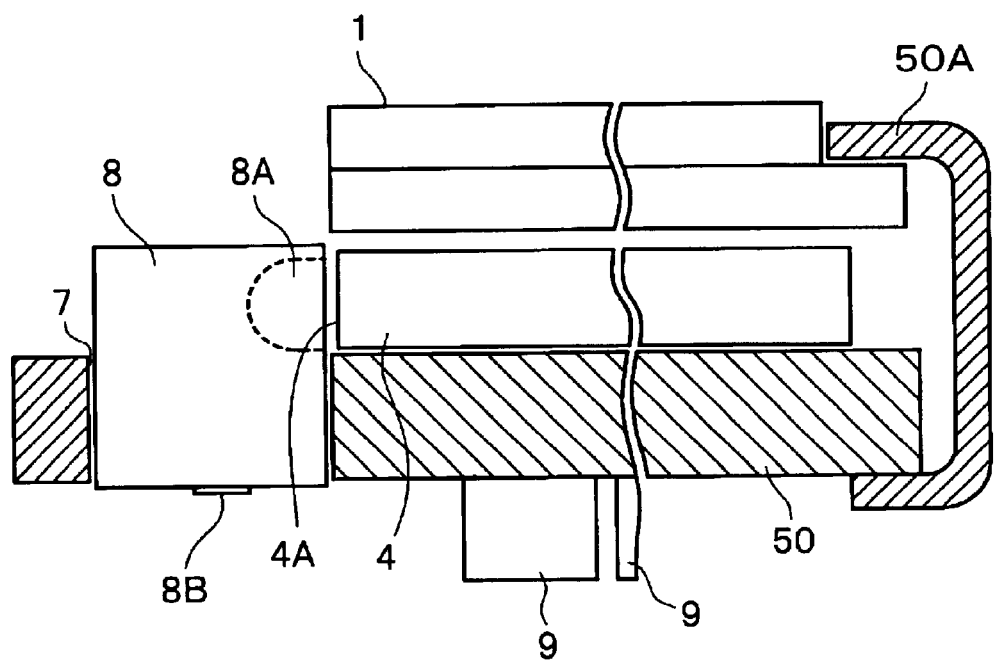
FIG. 4 is a diagrammatic explanatory cross-sectional view of the essential construction of a second embodiment of the liquid crystal display device according to the invention.

FIG. 4 is a diagrammatic explanatory cross-sectional view of the essential construction of a second embodiment of the liquid crystal display device according to the invention. In FIG. 4, the same reference numerals as those used in FIG. 1 denote the same functional parts as those shown in FIG. 1, and although the printed circuit board 5 of the first embodiment is a flexible printed circuit board, the second embodiment uses a hard printed circuit board 50. A connecting flexible printed sheet 50A is used to provide connection between the printed circuit board 50 and the terminal of the liquid crystal display panel 1.

Each of the LEDs 8 has a height which allows for the thickness of the printed circuit board 50. The LEDs 8 are secured (connected) to the printed circuit board 50 by the electrodes 8B similar to those used in the first embodiment. Specifically, LEDs each having a height corresponding to the thickness of the printed circuit board 50 are used as the LEDs 8.

According to the second embodiment, as to the printed circuit board 5 on which the LEDs 8 are mounted from the same side together with the other electronic components 9, the light-emitting portions 8A of the respective LEDs 8 can be disposed to be accurately directly opposed to the entrance surface 4A of the light guide 4 without the need to fold the printed circuit board 5 in the portion of the LEDs 8, thereby enabling a reduction in the number of process steps.

FIGS. 5A to 5C are explanatory views of the advantage of the mounting structure of the LEDs on the printed circuit board which constitutes the auxiliary illuminating device in the liquid crystal display device according to the invention. FIG. 5A is a schematic plan view showing for comparison purposes a case in which a printed circuit board does not have mounting through-holes for LEDs, while FIGS. 5B and 5C are schematic plan views showing different cases in each of which a printed circuit board has mounting through-holes for LEDs. Incidentally, each of the through-holes 7 shown in FIGS. 5B and 5C is formed to have a size which allows one LED 8 to be inserted through it without substantial looseness.

As shown in FIG. 5A, in the case where the through-holes 7 are not provided in the printed circuit board 5, it is difficult to dispose the light-emitting portions 8A of the LEDs 8 so that the light-emitting portions 8A are accurately directly opposed to the entrance surface 4A of the light guide 4. Accordingly, the directions in which lights emitted from the respective LEDs 8 enter the light guide 4 become irregular as shown by arrows and the light guide 4 cannot irradiate the liquid crystal display panel 1 with uniform illuminating light, with the result that display irregularity occurs in the liquid crystal display panel 1. In FIG. 5A, sign AR denotes an effective area (effective illumination area).

In contrast, as shown in FIG. 5B, in the case where a plurality of through-holes 7 for mounting the LEDs 8 are provided in the printed circuit board 5 at positions approximately equidistant from an adjacent end of the light guide 4, the distance between each of the LEDs 8 and the light guide 4 and the mounting attitude of each of the LEDs 8 is restricted by the corresponding one of the through-holes 7, whereby the directions in which lights emitted from the respective LEDs 8 enter the light guide 4 become regular as shown by arrows. In addition, as shown in FIG. 5C, by adjusting distances D1 and D2 of the plurality of LEDs 8 to the entrance surface 4A of the light guide 4, namely, by setting the distances of the respective through-holes 7 to the light guide 4 according to a desired luminance distribution of the light guide 4, it is possible to design into a desired pattern the distribution of illuminating light which exits from the light guide 4 toward the liquid crystal display panel 1.

Figures 6A, 6B, 6C:
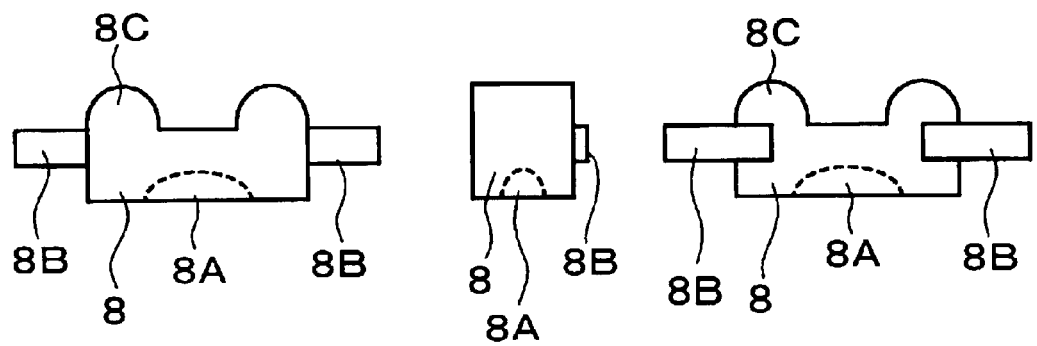
FIGS. 6A to 6C are explanatory views of the shape of the LED to be used in the auxiliary illuminating device which constitutes the liquid crystal display device according to the invention, FIG. 6A being a top view, FIG. 6B being a side view, and FIG. 6C being a bottom view.

FIGS. 6A to 6C are explanatory views of the shape of an LED to be used in the auxiliary illuminating device which constitutes the liquid crystal display device according to the invention. FIG. 6A is a top view, FIG. 6B is a side view, and FIG. 6C is a bottom view. This LED 8 has convex portions 8C on the (back) side opposite to the light-emitting portions 8A, and also has a pair of electrodes 8B to be connected to the wiring (power supply line) of the printed circuit board 5. The electrodes 8B are bridged to the mounting surface of the printed circuit board 5, and the light-emitting portion 8A is opposed to the entrance surface 4A of the light guide 4 on the opposite side to the mounting surface. Incidentally, the direction in which to dispose each of the electrodes 8B and the shapes thereof are not limited to the shown example, and may be any direction and any shape that enable the electrodes 8B to be bridged to the printed circuit board 5 and be secured and electrically connected thereto.

Figure 7:
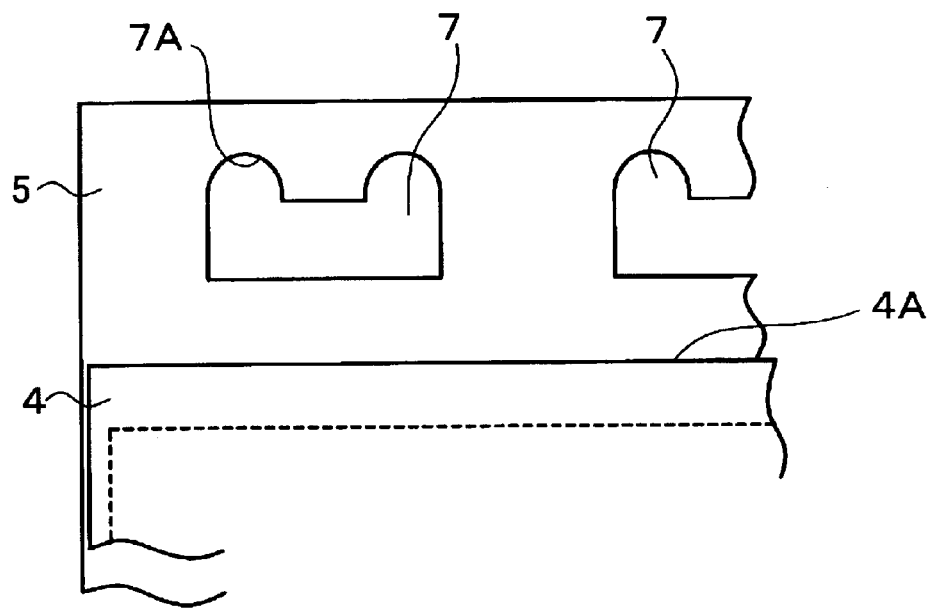
FIG. 7 is a partial plan view aiding in describing one example of a through-hole formed in the printed circuit board used in the auxiliary illuminating device which constitutes the liquid crystal display device according to the invention.

FIG. 7 is a partial plan view aiding in describing one example of the through-hole formed in the printed circuit board used in the auxiliary illuminating device which constitutes the liquid crystal display device according to the invention. The shown example corresponds to the through-hole 7 for mounting the LED 8 described with reference to FIGS. 6A to 6C. This through-hole 7 is an approximately rectangular hole having concave portions 7A which correspond to the respective convex portions 8C of the LED 8 shown in FIG. 6A. The through-hole 7 allows the LED 8 shown in FIGS. 6A to 6C to be inserted through itself, and restricts the insertion position of the LED 8 to set the distance of the LED 8 to the entrance surface 4A of the light guide 4 to a predetermined value.

Figures 8A, 8B, 8C:
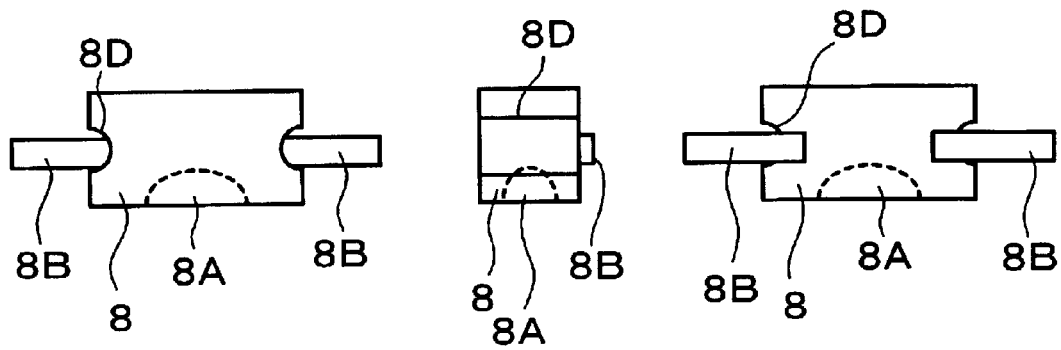
FIGS. 8A to 8C are explanatory views of another example of the shape of the LED to be used in the auxiliary illuminating device which constitutes the liquid crystal display device according to the invention, FIG. 8A being a top view, FIG. 8B being a side view, and FIG. 8C being a bottom view.

FIGS. 8A to 8C are explanatory views of another example of the shape of an LED to be used in the auxiliary illuminating device which constitutes the liquid crystal display device according to the invention. FIG. 8A is a top view, FIG. 8B is a side view, and FIG. 8C is a bottom view. This LED 8 has concave portions 8D in a direction parallel to the entrance surface 4A of the light guide 4 (on opposite sides), and also has a pair of electrodes 8B to be connected to the wiring (power supply line) of the printed circuit board 5. The electrodes 8B are bridged to the mounting surface of the printed circuit board 5, and the light-emitting portion 8A is opposed to the entrance surface 4A of the light guide 4 on the opposite side to the mounting surface. Incidentally, the direction in which to dispose each of the electrodes 8B and the shapes thereof may be any arbitrary ones that enable the electrodes 8B to be bridged to the printed circuit board 5 and be secured and electrically connected thereto.

Figure 9:
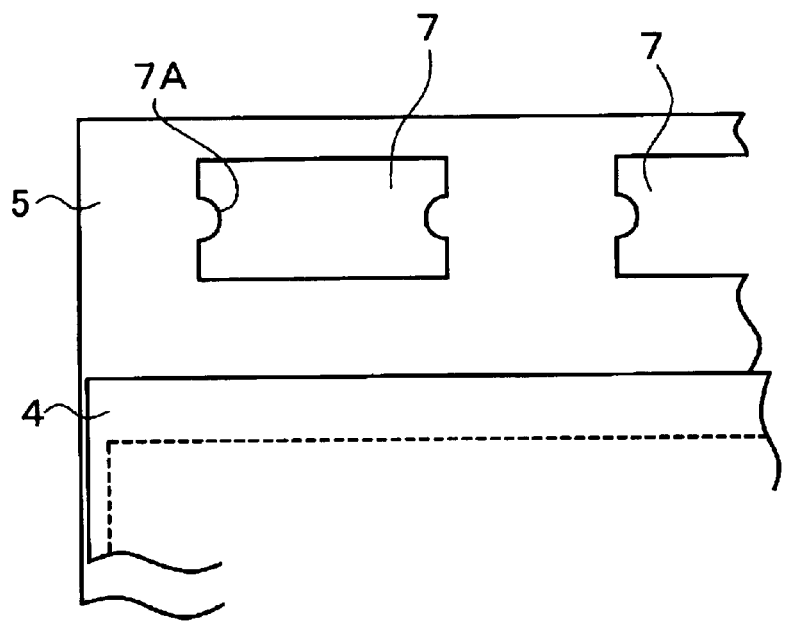
FIG. 9 is a partial plan view aiding in describing another example of the through-hole formed in the printed circuit board used in the auxiliary illuminating device which constitutes the liquid crystal display device according to the invention.

FIG. 9 is a partial plan view aiding in describing another example of the through-hole formed in the printed circuit board used in the auxiliary illuminating device which constitutes the liquid crystal display device according to the invention. The shown example corresponds to the through-hole 7 for mounting the LED 8 described with reference to FIGS. 8A to 8C. This through-hole 7 is an approximately rectangular hole having convex portions 7B which correspond to the respective concave portions 8D of the LED 8 shown in FIG. 8A. The through-hole 7 allows the LED 8 shown in FIGS. 8A to 8C to be inserted through itself, and restricts the insertion position of the LED 8 to set the distance of the LED 8 to the entrance surface 4A of the light guide 4 to a predetermined value.

Since each of the LEDs 8 and the corresponding one of the through-holes 7 of the printed circuit board 5 are shaped to have positioning means such as that shown in FIGS. 6A to 6C and 7 or that shown in FIGS. 8A to 8C and 9, the distance between each of the LEDs 8 and the entrance surface 4A of the light guide 4 and the opposition attitude of each of the LEDs 8 can easily be accurately set to predetermined values, respectively, whereby the distribution of light entering the light guide 4 is prevented from being disturbed. Accordingly, the liquid crystal display panel 1 can be illuminated with light of predetermined distribution, whereby a high-quality image display can be obtained.

Figure 10A:
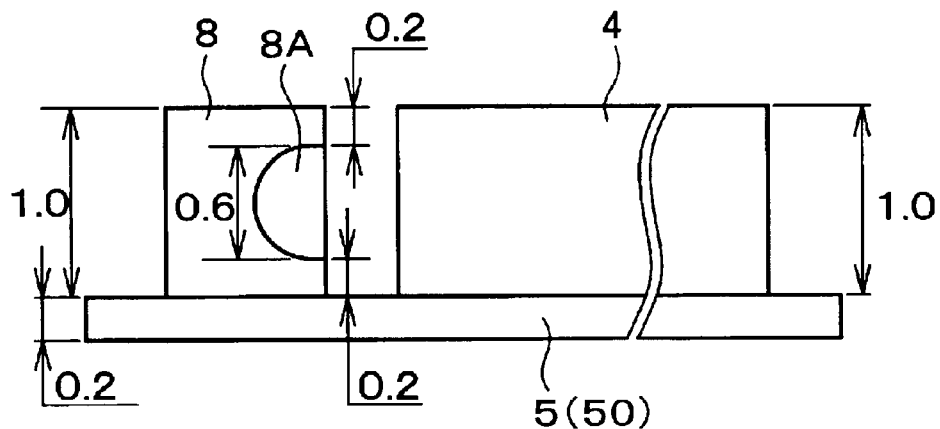
FIGS. 10A and 10B are diagrammatic explanatory cross-sectional views of the arrangement relationship between the printed circuit board and LEDs, which arrangement relationship provides another advantage according to the invention, FIG. 10A being a comparative arrangement view corresponding to FIG. 14, and FIG. 10B being a view showing a representative arrangement according to the invention.
Figure 10B:
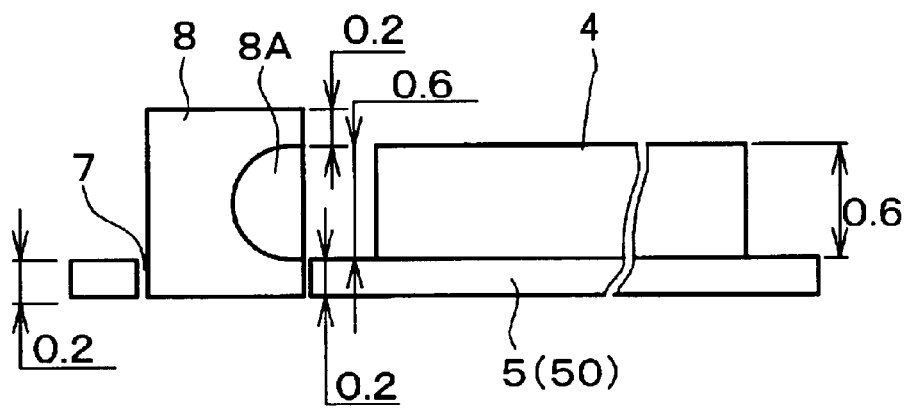
Figure 11:
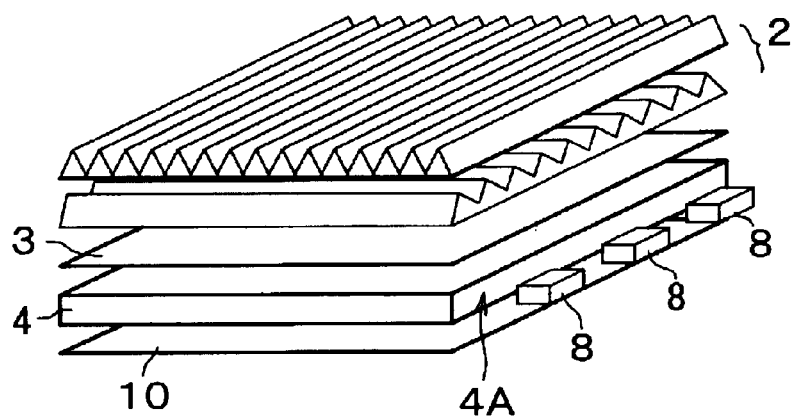
FIG. 11 is a diagrammatic explanatory perspective view of the entire construction of a related-art auxiliary illuminating device in a small-sized information terminal.
Figure 14:
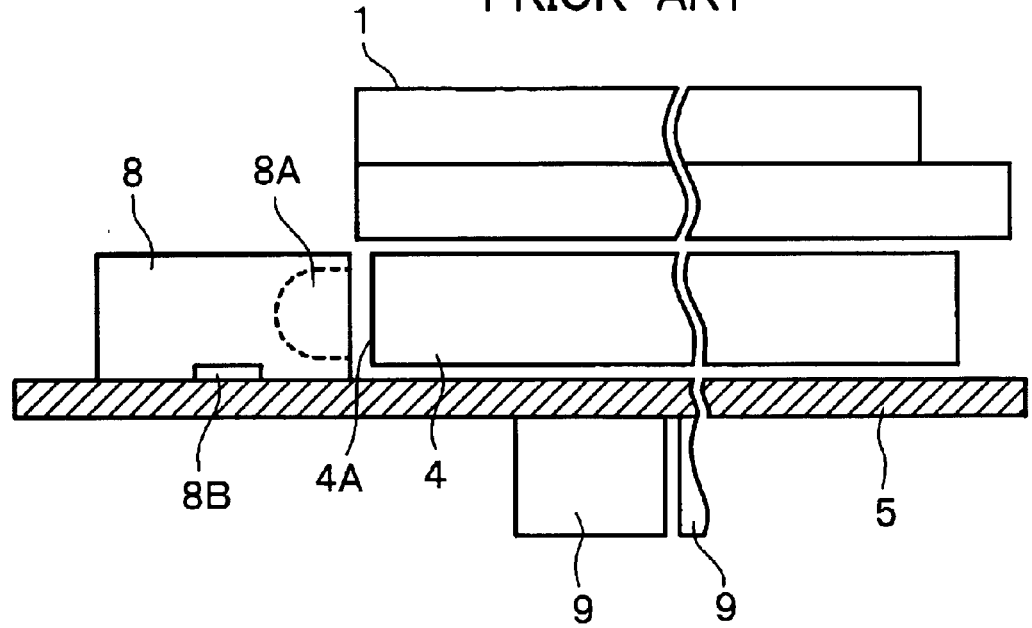
FIG. 14 is a diagrammatic explanatory view of an example of the essential construction of a liquid crystal display device, aiding in explaining the problem of the construction shown in FIG. 13.
Figure 15:
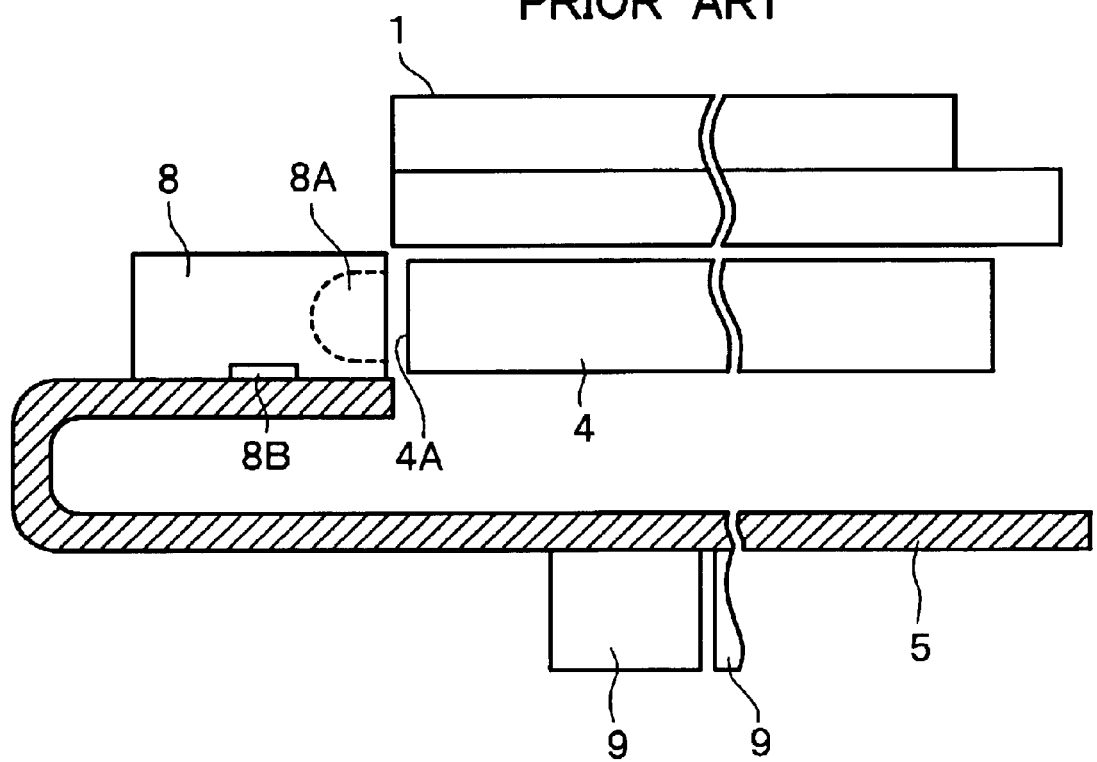
FIG. 15 is a diagrammatic explanatory view of an example of the essential construction of another proposed example of the auxiliary illuminating device in the small-sized information terminal.

FIGS. 10A and 10B are diagrammatic explanatory cross-sectional views of the arrangement relationship between the printed circuit board and the LEDs, which arrangement relationship provides another advantage according to the invention. FIG. 10A is a comparative arrangement view corresponding to FIG. 14 referred to previously, and FIG. 10B is a view showing a representative arrangement according to the invention. The numerical values shown in FIGS. 10A and 10B are mere examples, and their units are millimeters.

In this example, the thickness of the printed circuit board 5 or 50 is 0.2 mm, the entire height of each of the LEDs 8 is 1.0 mm, the heightwise size of the light-emitting portion 8A of each of the LEDs 8 is 0.6 mm, and the size between the top end of the LED mold and that of the light-emitting portion 8A and the size between the bottom end of the LED mold and that of the light-emitting portion 8A are 0.2 mm, respectively. As shown in FIG. 10A, in the case where the LEDs 8 are mounted on the surface of the printed circuit board 5 (50), the thickness of the light guide 4 is limited to 1.0 mm or less when the balance between the efficiency of utilization of emitted light and light entering the light guide 4 is taken into account in the thickness direction (in the vertical direction as viewed in FIG. 10A). Incidentally, if such balance is not taken into account, the thickness of the light guide 4 is reduced to 0.8 mm by 0.2 mm at the top end of the LED mold.

In contrast, according to the invention shown in FIG. 10B, the portion of the LED mold which does not contribute to light emission is embedded into the printed circuit board 5 (50) so that the position of the bottom end (lying on the side of the printed circuit board 5 (50)) of the light-emitting portion 8A of each of the LEDs 8 can be made close to the surface of the printed circuit board 5 (50). Accordingly, if the position of the bottom end is made approximately coincident with the surface of the printed circuit board 5 (50), the thickness of the light guide 4 can be reduced to 0.6 mm. Therefore, in this case, the total thickness of each of the LEDs 8 and the light guide 4 can be reduced to 0.8 mm, whereby the thickness of the entire liquid crystal display device including the auxiliary illuminating device can be made small. According to each of the above-described embodiments of the invention, it is possible to provide a liquid crystal display device capable of providing image display with high luminance free of display irregularity or with good color balance. Incidentally, it goes without saying that even if the position of the bottom end of the light-emitting portion 8A is not made coincident with the surface of the printed circuit board 5 (50), the advantage of a reduction in thickness can be obtained by mounting the respective LEDs 8 in the through-holes 7.

As is apparent from the foregoing description, according to the invention, the light-emitting elements 8 of the auxiliary illuminating device and the entrance surface (side edge) 4A of the light guide 4 can easily be accurately directly opposed to one another, whereby the luminance irregularity of illuminating light can be reduced and the efficient utilization of light exiting from the light-emitting elements 8 can be promoted.

In addition, the highly efficient utilization of light entering the light guide 4 is enabled, whereby luminance can be improved and the display irregularity of the liquid crystal display panel 1 can be reduced.

What is claimed is:

1. A liquid crystal display device comprising:
   a liquid crystal display panel;
   a printed circuit board on which a plurality of electronic components including a light-emitting element are mounted; and
   a light guide provided between the liquid crystal display panel and the printed circuit board,
   the printed circuit board including a through-hole,
   the light emitting element being mounted on the printed circuit board from a first side of the printed circuit board as other electronic components mounted thereon,
   a housing of the light-emitting element being projected from the through-hole into a second side of the printed circuit board opposite to the first side, a light-emitting portion of the light-emitting element being disposed in the housing to face a side edge the light guide.

2. A liquid crystal display device according to claim 1, wherein the light-emitting portion of the light-emitting element is projected from the printed circuit board into a side where the light guide is disposed.

3. A liquid crystal display device according to claim 1, wherein a light-emitting direction of the light-emitting element is approximately parallel to a surface of the printed circuit board.

4. A liquid crystal display device according to claim 1, wherein the printed circuit board is a flexible printed circuit board.

5. A liquid crystal display device according to claim 1, wherein the printed circuit board is a hard printed circuit board.

6. A liquid crystal display device according to claim 1, wherein the through-hole and the light-emitting element have positioning means.

7. A liquid crystal display device comprising:
   a liquid crystal display panel;
   a printed circuit board on which a light-emitting element is mounted; and
   a light guide provided between the liquid crystal display panel and the printed circuit board, the printed circuit board including a through-hole, the light-emitting element being mounted on the printed circuit board from a first side of the printed circuit board as other electronic components mounted thereon, housing of the light-emitting element being projected from the through-hole into a second side of the printed circuit board opposite to the first side, and the light-emitting element having a light-emitting direction approximately parallel to a surface of the second side of the printed circuit board.

8. A liquid crystal display device according to claim 7, wherein an end of the light-emitting portion of the light-emitting element on the side of the printed circuit board is approximately equal in position to the surface of the printed circuit board.

9. A liquid crystal display device according to claim 7, wherein the light guide is smaller in thickness than the light-emitting element in portion thereof which is projected from the through-hole of the printed circuit board.

10. A liquid crystal display device according to claim 7, wherein the printed circuit board is a flexible printed circuit board.

11. A liquid crystal display device according to claim 7, wherein the printed circuit board is a hard printed circuit board.

12. A liquid crystal display device according to claim 7, wherein the through-hole and the light-emitting element have positioning means.

13. A liquid crystal display device comprising:

a liquid crystal display panel;

a printed circuit board on which a plurality of electronic components including a light-emitting element are mounted; and a light guide provided between the liquid crystal display panel and the printed circuit board, the printed circuit board including a through-hole through which the light-emitting element is inserted, the light-emitting element being mounted on the printed circuit board from a first side of the printed circuit board as other electronic components mounted thereon, housing of the light-emitting element being projected from the through-hole into a second side of the printed circuit board opposite to the first side, and electrodes of the light-emitting element and electrodes of other electronic components being connected to the printed circuit board on the first side of the printed circuit board.

14. A liquid crystal display device according to claim 13, wherein the printed circuit board is a flexible printed circuit board.

15. A liquid crystal display device according to claim 13, wherein the printed circuit board is a hard printed circuit board.

16. A liquid crystal display device according to claim 13, wherein the through-hole and the light-emitting element have positioning means.

17. A liquid crystal display device comprising:

a liquid crystal display panel;

a printed circuit board on which a plurality of light-emitting elements are mounted; and a light guide provided between the liquid crystal display panel and the printed circuit board, the printed circuit board including a plurality of through-holes approximately equidistant from an end of the light guide, the plurality of light-emitting elements being mounted on the printed circuit board from a first side of the printed circuit board as other electronic components mounted thereon, a respective housing of each of the light-emitting elements being inserted through the through-holes into a second side of the printed circuit board opposite to the first side, and a respective light-emitting portion of the light-emitting elements being disposed in the respective housing to face a side edge the light guide.

18. A liquid crystal display device according to claim 17, wherein the through-holes and the light-emitting elements have positioning means.

19. A liquid crystal display device according to claim 17, wherein the printed circuit board is a flexible printed circuit board.

20. A liquid crystal display device according to claim 17, wherein the printed circuit board is a hard printed circuit board.

* * * * *